United States Patent
Roine et al.

(10) Patent No.: US 9,812,948 B2
(45) Date of Patent: Nov. 7, 2017

(54) DYNAMIC BROWN-OUT THRESHOLD VOLTAGE FOR POWER CONTROL

(71) Applicant: TEXAS INSTRUMENTS INCORPORATED, Dallas, TX (US)

(72) Inventors: Per Torstein Roine, Oslo (NO); Stefan Dannenberger, Langhus (NO); Danielle Griffith, Richardson, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/665,843

(22) Filed: Mar. 23, 2015

(65) Prior Publication Data

US 2016/0285438 A1  Sep. 29, 2016

(51) Int. Cl.
| | |
|---|---|
| H02M 1/36 | (2007.01) |
| H03K 17/22 | (2006.01) |
| G05F 1/46 | (2006.01) |
| G05F 1/10 | (2006.01) |

(52) U.S. Cl.
CPC .............. H02M 1/36 (2013.01); H03K 17/22 (2013.01)

(58) Field of Classification Search
CPC . H02M 1/36; H03K 17/22; G05F 1/46; G05F 1/10
USPC .. 327/52, 53, 58, 60, 62, 63, 65–69, 71, 72, 327/74, 77–81, 88, 89, 96, 127, 246, 266, 327/274, 280, 287, 359, 560–563
See application file for complete search history.

(56) References Cited

U.S. PATENT DOCUMENTS

| | | | | |
|---|---|---|---|---|
| 5,376,834 A | * | 12/1994 | Carobolante | G05F 1/46 327/143 |
| 6,160,391 A | | 12/2000 | Banba | |
| 6,600,437 B1 | * | 7/2003 | Confalonieri | H03M 1/68 327/554 |
| 6,798,254 B2 | * | 9/2004 | Marshall | H04L 25/063 327/205 |
| 6,894,627 B2 | * | 5/2005 | Janakiraman | H03M 1/06 341/102 |
| 7,619,402 B1 | * | 11/2009 | Kwong | G05F 1/575 323/297 |
| 7,724,075 B2 | * | 5/2010 | Yang | G05F 3/08 323/311 |
| 2002/0130710 A1 | * | 9/2002 | Mahrla | G05F 1/575 327/540 |
| 2004/0184910 A1 | * | 9/2004 | Busch | G05D 7/0676 415/13 |
| 2008/0272830 A1 | * | 11/2008 | Steedman | G01R 19/16552 327/530 |
| 2009/0092264 A1 | * | 4/2009 | Yamada | H03F 1/305 381/94.5 |
| 2009/0212762 A1 | * | 8/2009 | Van Oevelen | G01R 19/14 324/76.77 |
| 2010/0225304 A1 | * | 9/2010 | Wynne | G01R 15/04 324/126 |
| 2010/0264837 A1 | * | 10/2010 | Zhao | G01R 19/2506 315/189 |

(Continued)

*Primary Examiner* — Brandon S Cole
(74) *Attorney, Agent, or Firm* — Ronald O. Neerings; Charles A. Brill; Frank D. Cimino

(57) ABSTRACT

A method of operating a power up circuit is disclosed. The method includes receiving an input voltage and creating a plurality of sample voltages from the input voltage. One of the sample voltages is selected and compared to a reference voltage. The power up circuit produces a brown-out signal in response to the step of comparing.

20 Claims, 3 Drawing Sheets

(56) References Cited

U.S. PATENT DOCUMENTS

| | | | |
|---|---|---|---|
| 2010/0308890 A1* | 12/2010 | Schlueter | H03K 17/063 |
| | | | 327/383 |
| 2013/0009782 A1* | 1/2013 | Brandt | H01M 10/06 |
| | | | 340/657 |
| 2015/0042386 A1 | 2/2015 | Bhowmik et al. | |
| 2015/0116030 A1* | 4/2015 | Jarrar | H03K 17/162 |
| | | | 327/536 |
| 2015/0194949 A1* | 7/2015 | McQuirk | H03K 3/011 |
| | | | 327/291 |

* cited by examiner

DYNAMIC BROWN-OUT THRESHOLD VOLTAGE FOR POWER CONTROL

BACKGROUND OF THE INVENTION

Embodiments of the present invention relate to a system on a chip (SoC) having a dynamic rising brown-out threshold voltage to provide power up control and to support energy harvesting.

Power consumption of electronic devices has become an increasingly important design consideration. This is especially important with the proliferation of portable electronic devices using battery power as well as alternative energy sources. Utilizing these alternative energy sources is often referred to as energy harvesting. These alternative energy sources are typically characterized by low output voltage and high source impedance. They include amorphous solar cells, thermoelectric transducers, radio frequency receivers, and other available sources. Due to the relatively low output voltage of these sources, they are often combined with a charge pump to provide a usable output voltage level. The charge pump, however, has a very high source impedance with very low steady state output current capacity. This low steady state output current capacity complicates both power up and normal device operation. Embodiments of the present invention are directed to improving problems associated with power up operation of electronic devices as will be described in detail.

BRIEF SUMMARY OF THE INVENTION

In a preferred embodiment of the present invention, there is disclosed a method of operating a power up circuit of a System on a Chip (SoC). The method includes receiving an input voltage and creating a plurality of sample voltages from the input voltage. One of the sample voltages is selected and compared to a reference voltage. The power up circuit produces a brown-out signal in response to the step of comparing.

DETAILED DESCRIPTION OF THE INVENTION

Figure 1:
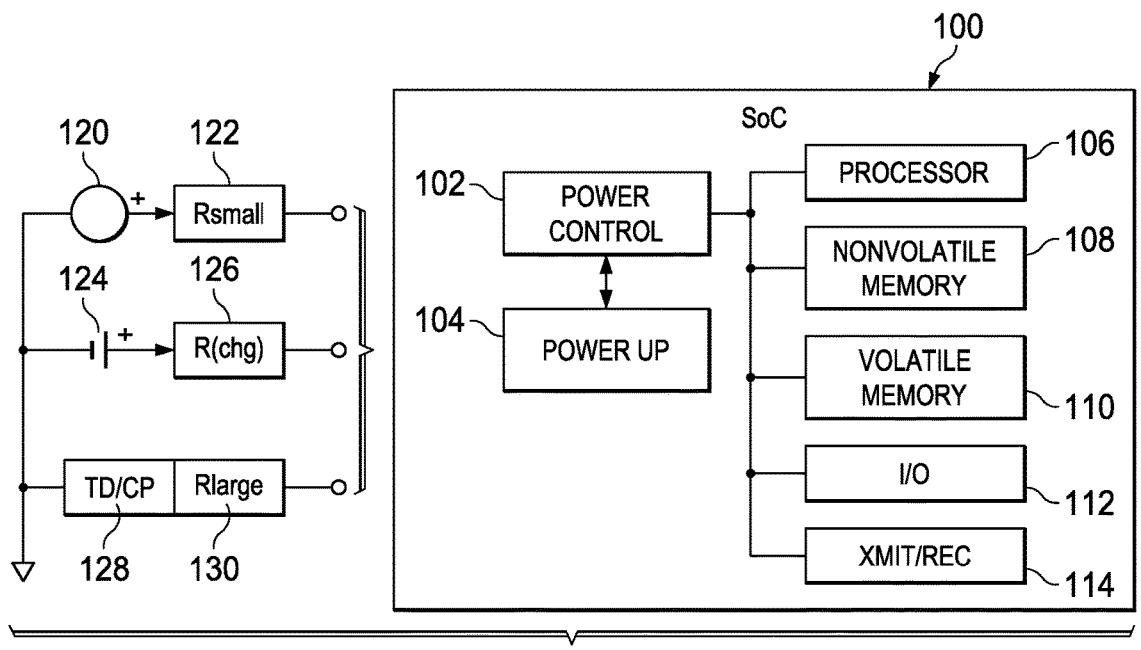
FIG. 1 is a diagram of a System on a Chip (SoC) showing various power sources that may be used to operate the SoC.

Referring to FIG. 1, there is a diagram of a system on a chip (SoC) showing various power sources that may be used to operate the SoC. The SoC 100 may be used in a variety of electronic devices such as laptop computers, tablets, cell phones, and other portable electronic devices. It may include a processor 106, nonvolatile memory 108, volatile memory 110, an input-output circuit 112, and a transmit-receive circuit 114. The SoC may further include a power control circuit 102 and a power up circuit 104.

The SoC 100 may be powered by a variety of power sources. For example, the SoC may be powered by a regulated power supply having a voltage source 120 and small source resistance 122. Alternatively, the SoC may be powered by a battery 124 with a corresponding source resistance 126 that depends on the charge of the battery. For example, a battery having a low charge may have an acceptable open circuit voltage but may have an unacceptable output voltage under load conditions. The SoC may also be powered by an energy harvesting circuit having an appropriate energy transducer and charge pump 128. The energy harvesting circuit has a large source resistance 130 due to the charge pump so that steady state output current depends on the size of each charge packet and the operating frequency of the charge pump.

In operation, power is applied to SoC 100 from one of the energy sources and the SoC attempts to bootstrap or boot itself. This is generally a process whereby the processor reads basic software such as an operating system from nonvolatile memory. The operating system then loads other software as needed and performs power management functions via power control circuit 102. For example, the processor may regulate I/O 112, or XMIT/REC 114 operations based on available power or may enter standby or sleep modes of operation. One of the problems with booting the SoC, however, is that the energy source is generally unknown by the SoC prior to a successful boot operation. Thus, power up circuit 104 must accommodate a variety of energy sources during the boot operation.

Figure 2:
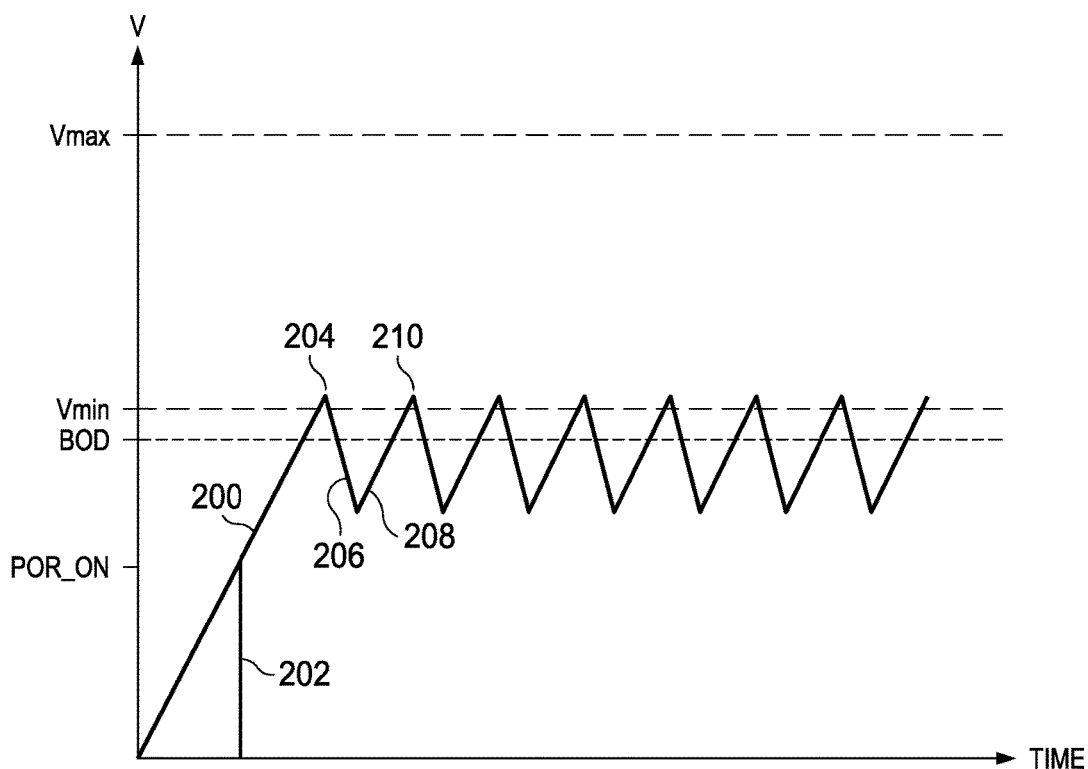
FIG. 2 is a diagram showing a power up problem that may be encountered with an energy harvesting power supply.

A regulated supply voltage 120 with small source resistance 122, such as with a USB port or charger, may successfully boot due to available steady state current at an acceptable operating voltage. However, a low battery or energy harvesting system may fail to boot as shown at FIG. 2. The diagram of FIG. 2 illustrates a power-on reset (POR) signal POR_ON 202, a fixed brown-out detection (BOD) threshold, and minimum (Vmin) and maximum (Vmax) operating supply voltage levels as a function of time during power up. The BOD threshold is used to detect an supply voltage interruption or supply voltage failure so that pending I/O operations may be terminated and the processor may conduct an orderly shutdown of the SoC. During power up, supply voltage level 200 increases above a POR threshold so that signal POR_ON goes high 202. The high level of POR_ON enables the power up circuit 104. The supply voltage 200 continues to increase to a level 204 above the BOD threshold and Vmin. At this level, the processor attempts to boot the SoC. An energy source with a high source resistance, however, may require a greater current than the energy source can supply. In this case, the supply voltage decreases 206 to a level below the BOD threshold. The power control circuit 102 then informs the processor 106 of a power supply failure or brown-out. Processor 106 responsively ceases the boot operation and removes the load current. POR_ON is still high, so the power up circuit 104, power control circuit 102, and processor 106 resume the power up operation 208. The supply voltage again increases to a level 210 that is greater than the BOD threshold and Vmin. The processor again attempts to boot the SoC with the same result. This process may continue and a successful boot may never be achieved. Embodiments of the present invention are directed to resolving this potential problem as will be discussed in detail.

Figure 3:
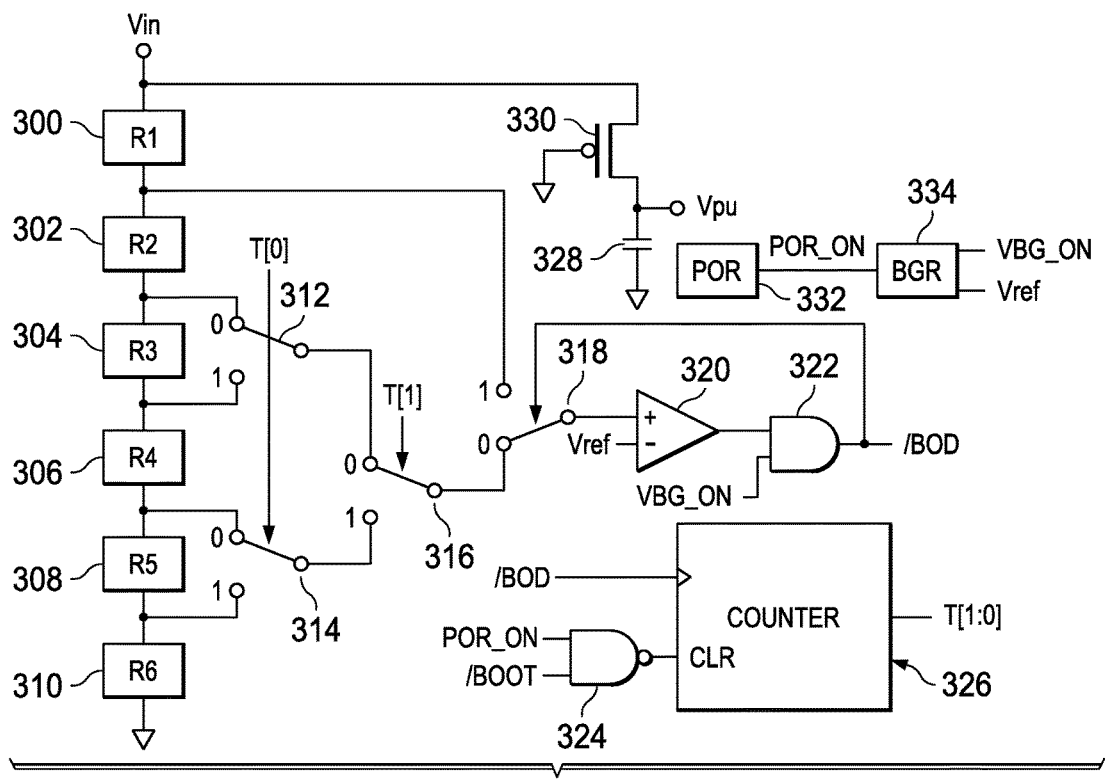
FIG. 3 is a schematic diagram of a power up circuit of the present invention that may be used with the SoC of FIG. 1.

Referring to FIG. 3, there is a schematic diagram of a power up circuit of the present invention that may be used with the SoC of FIG. 1. The power up circuit is powered by p-channel transistor 330 and capacitor 320 to produce a relatively stable local supply voltage Vpu during power up. The power up circuit includes a digital-to-analog (DAC) converter, a reference generator, a comparator, and a digital counter. Preferred embodiments of these circuits will now be described in detail. However, one of ordinary skill in the art with reference to the instant specification will understand that other suitable design alternatives may also be used without departing from the inventive concept of the present invention.

The DAC will now be described with reference to FIGS. 3 and 4. The DAC includes series-connected resistors R1 through R6 300-310 and switches 312-318. Resistor R1 300 is coupled to receive input voltage Vin. Vin may be an external power supply voltage from one of the previously described power supplies (FIG. 1) to power the SoC. Resistor R6 310 is coupled to power supply voltage Vss or ground as indicated by the small triangle. Series-connected resistors R1-R6 divide voltage Vin to provide a decreasing series of sample voltages. In a preferred embodiment of the present invention, series-connected resistors are desirable to accommodate low voltage operation. However, other circuit elements such as diodes or transistors may be used alone or in combination with the resistors to provide suitable voltage drops. Switches 312-316 are arranged to couple one of the sample voltages to a positive input terminal of comparator 320 as determined by bits T[1:0] from counter 326.

Figure 4:
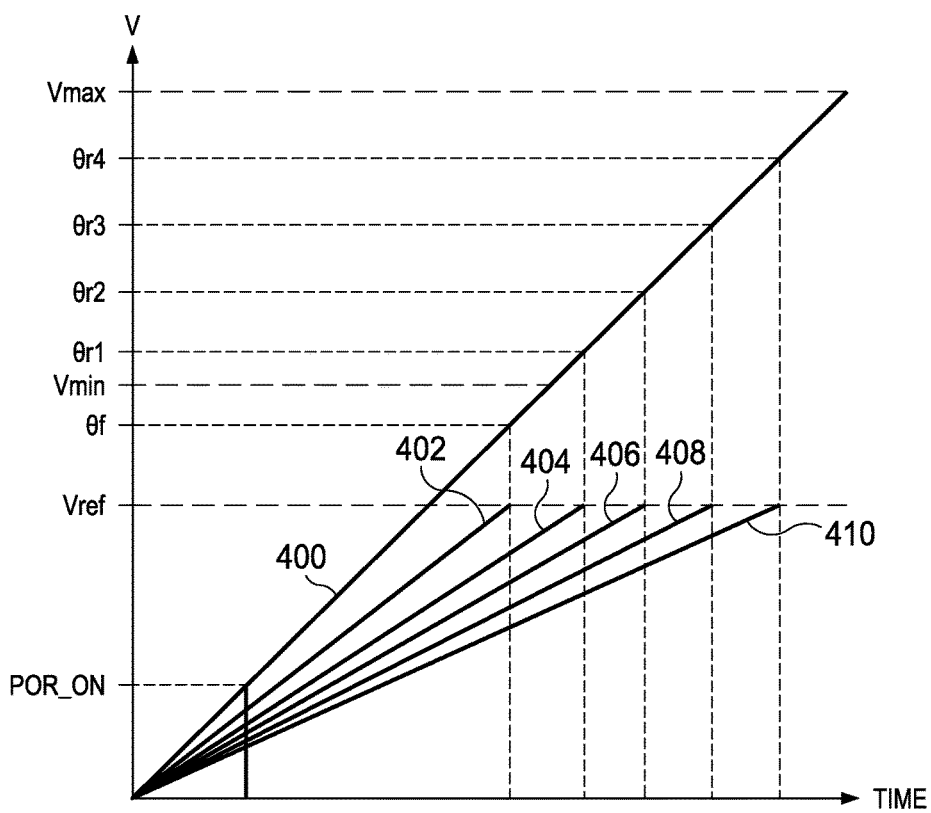
FIG. 4 is a diagram showing threshold voltages of a digital-to-analog converter circuit of FIG. 3.

FIG. 4 illustrates threshold voltages of the DAC as a function of time during power up. POR_ON is an output voltage of power-on reset (POR) circuit 332 in response increasing Vin 400. The POR circuit may one of various designs known to those of ordinary skill in the art as disclosed by Bhowmik et al. in U.S. patent application Ser. No. 14/140,204, filed Dec. 24, 2013, and incorporated herein by reference in its entirety. The POR_ON signal remains low until Vin reaches a predetermined threshold such as a transistor threshold voltage. The POR_ON signal then goes high and remains approximately equal to Vin 400.

Reference voltage Vref is preferably produced by a bandgap reference (BGR) circuit 334. The BGR circuit may one of various designs known to those of ordinary skill in the art such as a Widlar or Brokaw design. The BGR circuit may also be a low voltage design as disclosed by Banba in U.S. Pat. No. 6,160,391, filed Jul. 27, 1998, and incorporated herein by reference in its entirety. Alternatively, reference voltage Vref may be produced by other reference sources such as a diode drop or transistor threshold voltage as is known by those of ordinary skill in the art.

The vertical scale of FIG. 4 also indicates minimum (Vmin) and maximum (Vmax) operating voltages of the SoC as well as Vin 400 threshold voltages. Threshold voltage θf is a falling BOD threshold generated at the junction of resistors R1 and R2. Threshold voltage θr1 is a first rising BOD threshold generated at the junction of resistors R2 and R3. Threshold voltage θr2 is a second rising BOD threshold generated at the junction of resistors R3 and R4. Threshold voltage θr3 is a third rising BOD threshold generated at the junction of resistors R4 and R5. Threshold voltage θr4 is a fourth rising BOD threshold generated at the junction of resistors R5 and R6.

During power up of the SoC, a rising level of Vin 400 generates corresponding rising sample voltages 402-410. For example, when input voltage Vin is equal to threshold voltage θf, sample voltage 402 is equal to Vref. Likewise, when input voltage Vin is equal to threshold voltage θr1, sample voltage 404 is equal to Vref. Threshold voltage θf is preferably slightly less than Vmin and indicates a brown-out or power fail condition to power control circuit 102 (FIG. 1) when Vin falls below θf. During normal circuit operation, threshold voltage θr1 is preferably slightly greater than Vmin and indicates there is no brown-out or power fail condition to power control circuit 102 (FIG. 1) when Vin rises above θr1. Vin 400 is equal to threshold values θr2 through θr4 when respective sample voltages 406-410 equal reference voltage Vref.

Switches 312 through 318 are arranged to apply a selected sample voltage to the positive input terminal of comparator 320. The switches may be bipolar transistors, metal oxide semiconductor (MOS) transistors, complementary MOS (CMOS) transmission gates, logic gates, or other suitable switching means. The negative input terminal is coupled to receive reference voltage Vref from BGR circuit 334. The output terminal of comparator 320 is coupled to one input terminal of AND gate 322. The other input terminal of AND gate 322 is coupled to receive signal VBG_ON. VBG_ON is produced by BGR circuit 334 to indicate reference voltage Vref has achieved a stable reference value. When the output of comparator 320 and VBG_ON are both high, AND gate 322 produces a high level of signal /BOD to indicate there is no brown-out or power fail condition. Alternatively, an active low level of /BOD indicates Vin is less than threshold θf, and the corresponding sample voltage at the junction of resistors R1 and R2 is less than Vref. Switches 312 through 316 are controlled by bits T[1:0] from counter 326. Counter 326 is initially cleared to T[1:0]=00 by a low level of either POR_ON or /BOOT. Here, /BOOT is an active low signal to indicate that the SoC has successfully booted. Alternatively, a high level of /BOOT indicates that the SoC has not successfully booted. Counter 326 is incremented by a low-to-high transition of /BOD as will be explained in detail.

Figure 5:
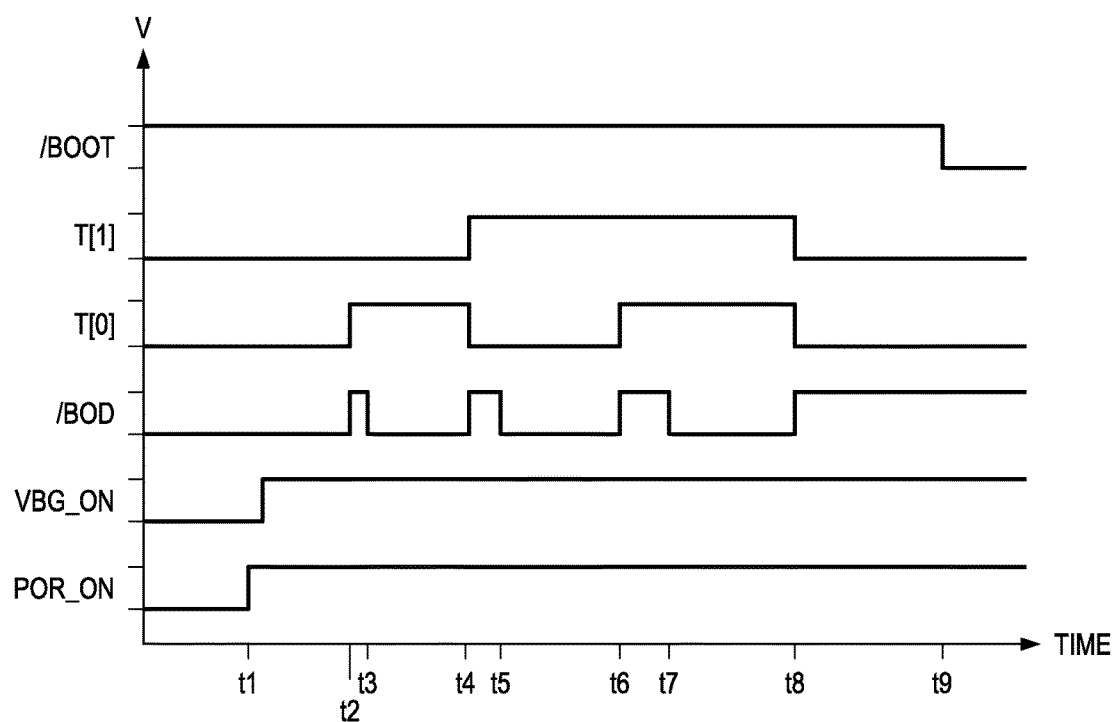
FIG. 5 is a timing diagram showing operation of the circuit of FIG. 3.
Figure 6:
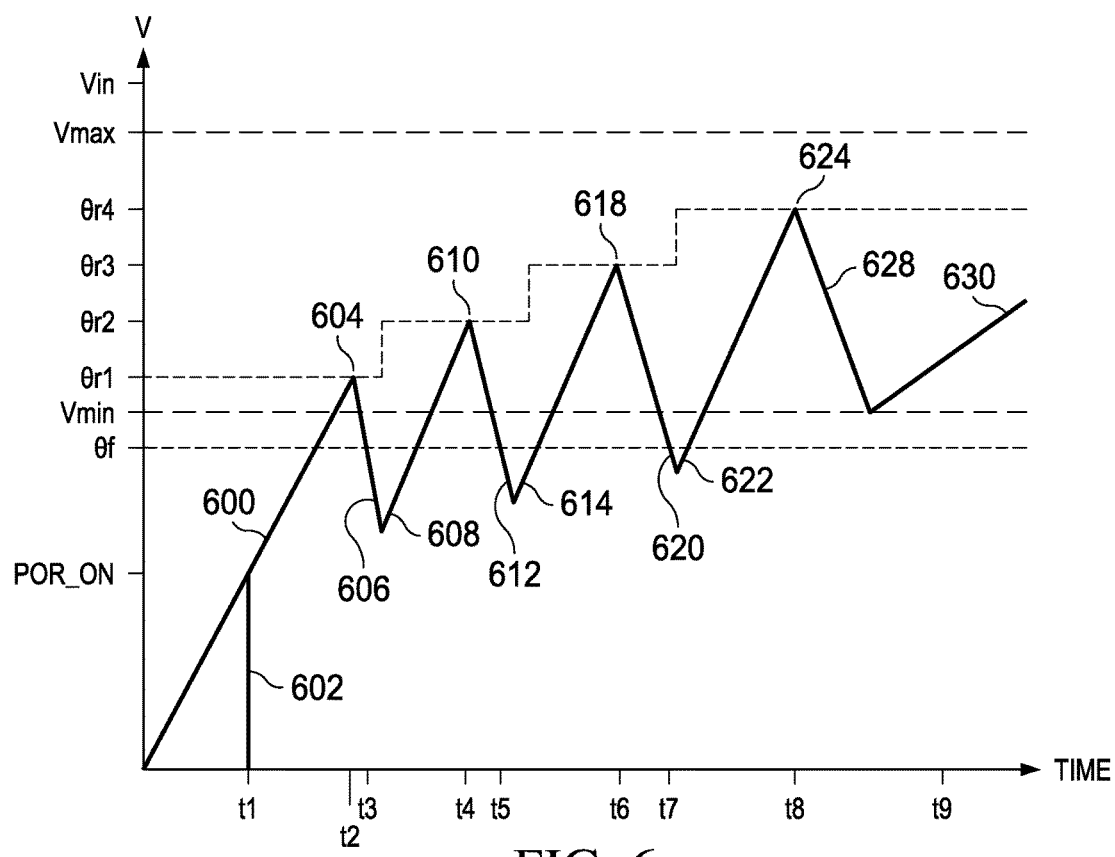
FIG. 6 is a timing diagram showing supply voltage variations of the circuit of FIG. 3 during power up.

Operation of the power up circuit of FIG. 3 will now be explained with reference to the timing diagrams of FIGS. 5 and 6. Times t1 through t9 are the same for FIGS. 5 and 6 during the power up operation. Initially, Vin is 0 V, switches 312 through 318 are in their 0 position, and counter 326 is initialized to T[1:0]=00. Vin 600 rises and charges capacitor 328 through p-channel transistor 330 to provide local supply voltage Vpu. At time t1, Vin is sufficiently high to activate a high level of POR_ON followed closely by a high level of VBG_ON. The high level of VBG_ON enables AND gate 322, but Vin is still below threshold θr1, so /BOD remains low. Thus, switch 318 remains in its 0 position.

At time t2, Vin crosses threshold θr1 604 and produces a sample voltage at the junction of resistors R2 and R3 that is greater than Vref. This sample voltage is applied to the positive input terminal of comparator 320 through switches 312, 316, and 318 and produces a high level output. The high level output is applied to AND gate 322 to produce a high level of /BOD. The high level of /BOD moves switch 318 to its 1 position and signals power control circuit 102 to boot the SoC. The low-to-high transition of /BOD also increments counter 326 to produce T[1:0]=01 and move switches 312 and 314 to their respective 1 positions. The SoC begins the boot process, but the power supply series resistance is too high to complete the process. Thus, Vin falls along curve 606.

At time t3, Vin crosses threshold θf and produces a low level output from comparator 320. The low level output produces a low level of /BOD and moves switch 318 to its 0 position. The low level of /BOD indicates a brown-out or power fail to power control circuit 102, and the boot operation is terminated. With the resulting reduction in load current, Vin rises along curve 608.

At time t4, Vin crosses threshold θr2 610 and produces a sample voltage at the junction of resistors R3 and R4 that is greater than Vref. This sample voltage is applied to the positive input terminal of comparator 320 through switches 312, 316, and 318 and produces a high level output. The high level output is applied to AND gate 322 to produce a high level of /BOD. The high level of BOD moves switch 318 to its 1 position and signals power control circuit 102 to boot the SoC. The low-to-high transition of /BOD also increments counter 326 to produce T[1:0]=10 and moves switches 312 and 314 to their respective 0 positions and switch 316 to its 1 position. The SoC begins the boot process, but the power supply series resistance is too high to complete the process. Thus, Vin falls along curve 612.

At time t5, Vin again crosses threshold θf and produces a low level output from comparator 320. The low level output produces a low level of /BOD and moves switch 318 to its 0 position. The low level of /BOD indicates a brown-out or power fail to power control circuit 102, and the boot operation is terminated. With the resulting reduction in load current, Vin rises along curve 614.

At time t6, Vin crosses threshold θr3 618 and produces a sample voltage at the junction of resistors R4 and R5 that is greater than Vref. This sample voltage is applied to the positive input terminal of comparator 320 through switches 314, 316, and 318 and produces a high level output. The high level output is applied to AND gate 322 to produce a high level of /BOD. The high level of /BOD moves switch 318 to its 1 position and signals power control circuit 102 to boot the SoC. The low-to-high transition of /BOD also increments counter 326 to produce T[1:0]=11 and moves switches 312 and 314 to their respective 1 positions. The SoC begins the boot process, but the power supply series resistance is too high to complete the process. Thus, Vin falls along curve 620.

At time t7, Vin again crosses threshold θf and produces a low level output from comparator 320. The low level output produces a low level of /BOD and moves switch 318 to its 0 position. The low level of /BOD indicates a brown-out or power fail to power control circuit 102, and the boot operation is terminated. With the resulting reduction in load current, Vin rises along curve 622.

At time t8, Vin crosses threshold θr4 624 and produces a sample voltage at the junction of resistors R5 and R6 that is greater than Vref. This sample voltage is applied to the positive input terminal of comparator 320 through switches 314, 316, and 318 and produces a high level output. The high level output is applied to AND gate 322 to produce a high level of /BOD. The high level of /BOD moves switch 318 to its 1 position and signals power control circuit 102 to boot the SoC. The low-to-high transition of /BOD also increments counter 326 to produce T[1:0]=00 and moves switches 312 through 316 to their respective 0 positions. The SoC once again begins the boot process, and Vin decreases along curve 628 to Vmin. The boot process is completed even with the high power supply series resistance by using charge stored in the SoC system capacitance. Once the boot operation is complete, the SoC controls system operation and regulates power supply loading. Thus, Vin rises along curve 630 to an operational level.

At time t9, the power control circuit 102 produces a low level /BOOT signal to indicate the boot operation is complete. The low level of /BOOT is applied to one input of NAND gate 324 to produce a high level output signal. The high level output signal assures that counter 326 is reset to T[1:0]=00 even if the boot operation is complete before Vin reaches threshold θr4. Thus, switches 312 through 318 are all reset to their respective 0positions.

Embodiments of the present invention offer several advantages over the prior art. First, power up problems as discussed with regard to FIG. 2 related to power supplies with unknown source resistance are greatly reduced or eliminated. Second, existing system capacitance of the SoC is used to provide sufficient load current to boot the SoC. No additional power supply constraints are imposed on the SoC. Third, the power up circuit employs an incremental BOD rising threshold voltage to incrementally increase available charge stored on the system capacitance until a successful boot is completed. It would not be possible to initially set the BOD rising threshold high, since a low power supply voltage within specified limits but below the high BOD rising threshold would never permit the SoC to boot. Fourth, a separate BOD falling threshold is used to detect a brown-out or power fail condition. This permits an orderly shutdown of the SoC in order to terminate pending I/O requests and reject new I/O requests. Finally, the present invention is equally compatible with wired power supplies, low battery power supplies, and energy harvesting power supplies.

Still further, while numerous examples have thus been provided, one skilled in the art should recognize that various modifications, substitutions, or alterations may be made to the described embodiments while still falling with the inventive scope as defined by the following claims. For example, although a preferred embodiment of the present invention discloses a variable BOD rising threshold responsive to a two-bit counter, any number of bits may be used. The BOD rising threshold may be determined by a one-bit counter or flip-flop for simplicity or by a greater number of counter bits for greater threshold resolution. Other combinations will be readily apparent to one of ordinary skill in the art having access to the instant specification.

What is claimed is:

1. A circuit, comprising:
   a plurality of series-connected elements coupled to receive an input voltage and produce a plurality of rising sample voltages and a falling sample voltage, each sample voltage having a magnitude less than a magnitude of the input voltage;
   a plurality of switching devices arranged to select at least one of the rising sample voltages;
   a counter arranged to provide a signal to control the plurality of switching devices;
   a comparator circuit arranged to produce an output signal in response to an input signal and a reference voltage; and
   a logic circuit arranged to produce the input signal from one of said at least one of the rising sample voltages and the falling sample voltage in response to the output signal.

2. A circuit as in claim 1, wherein the circuit is arranged to receive the input voltage from a regulated power supply at a first time, and wherein the circuit is arranged to receive the input voltage from a battery at a second time.

3. A circuit as in claim 1, wherein the circuit is arranged to receive the input voltage from a regulated power supply at a first time, and wherein the circuit is arranged to receive the input voltage from an energy harvesting circuit at a second time.

4. A circuit as in claim 1, wherein the comparator circuit is arranged to produce a power up output signal in response to said at least one of the rising sample voltages, and wherein the comparator circuit is arranged to produce a brown-out output signal in response to said falling sample voltage.

5. A circuit as in claim 4, wherein the brown-out output signal indicates a power supply failure, and wherein the power up output signal indicates no power supply failure.

6. A circuit as in claim 1, wherein the falling sample voltage has a magnitude greater than the plurality of rising sample voltages.

7. A circuit as in claim 1, comprising a hand-gap reference circuit arranged to produce the reference voltage.

8. A circuit as in claim 1, comprising a transistor threshold voltage reference circuit arranged to produce the reference voltage.

9. A circuit as in claim 1, comprising a diode drop reference circuit arranged to produce the reference voltage.

10. A method of operating a circuit, comprising:
 a) receiving an input voltage;
 b) creating a falling sample voltage and a plurality of rising sample voltages from the input voltage;
 c) selecting one of the rising sample voltages;
 d) comparing the selected rising sample voltage to a reference voltage when the selected rising sample voltage is less than the reference voltage; and
 e) comparing the falling sample voltage to the reference voltage when the selected rising sample voltage is greater than the reference voltage.

11. A method as in claim 10, comprising dividing the input voltage to produce the falling sample voltage and the plurality of rising sample voltages.

12. A method as in claim 10, comprising operating a counter to perform the step of selecting.

13. A method as in claim 10, wherein the selected rising sample voltage initiates a power up procedure when it is greater than the reference voltage.

14. A method as in claim 10, comprising:
 f) initiating a power up procedure of the circuit when the selected rising sample voltage is greater than the reference voltage;
 g) terminating the power up procedure if the falling sample voltage falls below the reference voltage;
 h) selecting another of the rising sample voltages in response to step (g); and
 i) repeating steps (d) through (h) until the power up procedure is complete.

15. A method of operating a circuit, comprising:
 receiving an input voltage;
 producing a falling sample voltage and a plurality of rising sample voltages in response to the input voltage;
 comparing an input signal to a reference voltage to produce an output signal; and
 producing the input signal from one of a selected rising sample voltage and the falling sample voltage in response to the output signal.

16. A method as in claim 15, comprising producing the falling and rising sample voltages by dividing the input voltage.

17. A method as in claim 16, dividing the input voltage by a plurality of series-connected resistor.

18. A method as in claim 15, comprising comparing the selected rising sample voltage to the reference voltage to produce a power up signal.

19. A method as in claim 15, wherein a first logic state of the output signal initiates a power up procedure of the circuit, and wherein a second logic state of the output signal terminates the power up procedure of the circuit.

20. A method as in claim 15, comprising:
 comparing the selected rising sample voltage to the reference voltage when the selected rising sample voltage is less than the reference voltage; and
 comparing the falling sample voltage to the reference voltage when the selected rising sample voltage is greater than the reference voltage.

* * * * *